United States Patent
Ohtsu et al.

(10) Patent No.: US 7,568,846 B2
(45) Date of Patent: Aug. 4, 2009

(54) OPTICAL RECEPTION AND TRANSMISSION MODULE

(75) Inventors: Shigemi Ohtsu, Kanagawa (JP); Toshihiko Suzuki, Kanagawa (JP); Masahiro Igusa, Kanagawa (JP); Kazutoshi Yatsuda, Kanagawa (JP); Akira Fujii, Kanagawa (JP); Keishi Shimizu, Kanagawa (JP); Eiichi Akutsu, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/176,561

(22) Filed: Jul. 21, 2008

(65) Prior Publication Data

US 2009/0103856 A1  Apr. 23, 2009

(30) Foreign Application Priority Data

Oct. 23, 2007   (JP)  ............................. 2007-274929

(51) Int. Cl.
  *G02B 6/42* (2006.01)
  *H04B 10/12* (2006.01)
(52) U.S. Cl. ........................................ 385/91; 398/142
(58) Field of Classification Search .................. 385/91; 398/141–142
See application file for complete search history.

(56) References Cited

U.S. PATENT DOCUMENTS

| 7,298,941 | B2* | 11/2007 | Palen et al. ................... 385/33 |
| 2004/0067025 | A1* | 4/2004 | Haraguchi et al. ............ 385/49 |
| 2006/0192278 | A1* | 8/2006 | Furuyama et al. ........... 257/686 |
| 2006/0274997 | A1* | 12/2006 | Furuno et al. ................. 385/89 |

FOREIGN PATENT DOCUMENTS

| JP | 2000-321453 A | 11/2000 |
| JP | 2001-100063 A | 4/2001 |
| JP | 2006-101891 A | 1/2006 |

\* cited by examiner

*Primary Examiner*—Jerry T Rahll
(74) *Attorney, Agent, or Firm*—Sughrue Mion, PLLC (57) ABSTRACT

An optical waveguide film of an optical reception and transmission module guides light. A first optical path converting part of an optical transmission unit guides light. A mirror surface of a first optical path converting part bends light which is emitted from a light emitting element and which enters the first optical path converting part. A first holding member holds the light emitting element and the first optical path converting part. A second optical path converting part of an optical reception unit guides light. A mirror surface of a second optical path converting part bends the guided light. A second holding member holds the light receiving element and the second optical path converting part. A first supporting member supports the first end portion of the optical waveguide film. A second supporting member supports the second end portion of the optical waveguide film.

16 Claims, 8 Drawing Sheets

OPTICAL RECEPTION AND TRANSMISSION MODULE

CROSS-REFERENCE TO RELATED APPLICATION

This application is based on and claims priority under 35 USC 119 from Japanese Patent Application No. 2007-274929 filed Oct. 23, 2007.

BACKGROUND

1. Technical Field

The present invention relates to an optical reception and transmission module.

2. Related Art

In IC technology and LSI technology, it has been noticed that in order to improve operating speed and integration level, optical wiring is mounted between devices, between boards in devices, and between chips in devices instead of mounting high-density electric wiring. In some cases, an optical reception and transmission module with an optical waveguide film is used to realize this optical wiring.

In such an optical reception and transmission module, as a connection method between a surface light emitting element or a surface light receiving element and an optical waveguide, there are proposed (1) a method in which a surface element is stood at 90° and is connected to an optical waveguide, (2) a method in which a 90-degree turning back mirror is used between a surface element and a waveguide and connects them, (3) a method in which a 90-degree turning back mirror is formed in a waveguide and the waveguide connects to a surface element, (4) a method in which a waveguide is stood vertically and connects to a surface element, and the like.

However, in the method of (1), there is a problem with electrode wiring of the surface element, that is, in that the electrode wiring by wire bonding may not be mounted. In the method of (2), there is a problem in that a lens is required besides the external mirror, resulting in an increase in cost, and a difficulty in downsizing. In the method of (3), although the mounting is easy, there have remained a problem with limited performance of the 90-degree turning back mirror, and a problem with cost as a mobile application, such as exchange of an optical waveguide film, compatibility between solder heat resistance and bending performance. In the method of (4), there are problems with mountability of the waveguide and bending a waveguide, and thus, there are many problems with mounting size and the like in the mobile application so that the method is impractical.

As a representative example of the method of (3), there has been known a technique in which a 45-degree mirror is manufactured by a dicer to be utilized for converting an optical path. In this constitution, however, it is difficult to satisfy both of bending performance required especially when it is used in the mobile application or the like, and heat resistance for withstanding heat applied during sealing of wire bonding in mounting, or the like.

SUMMARY

According to an aspect of the invention, there is provided an optical reception and transmission module including an optical waveguide film that guides light; an optical transmission unit comprising a light emitting element, a first optical path converting part that guides light, and that comprises, at a first end surface thereof in an optical waveguide direction, a mirror surface that bends light which is emitted from the light emitting element and which enters the first optical path converting part from an incident end surface thereof, and a first holding member that holds the light emitting element and the first optical path converting part so that the light emitted from the light emitting element is coupled to the incident end surface of the first optical path converting part; an optical reception unit comprising a light receiving element, a second optical path converting part that guides light and comprises, at a first end surface thereof in the optical waveguide direction, a mirror surface that bends the guided light, and a second holding member that holds the light receiving element and the second optical path converting part so that the light bent by the mirror surface of the second optical path converting part is received by the light receiving element; a first supporting member comprising a first hole portion into which a first end portion of the optical waveguide film is inserted, and which supports the first end portion of the optical waveguide film inserted into the first hole portion so that a first end surface of the optical waveguide film in the optical waveguide direction and a second end surface of the first optical path converting part in the optical waveguide direction are optically coupled; and a second supporting member comprising a second hole portion into which a second end portion of the optical waveguide film is inserted, and which supports the second end portion of the optical waveguide film inserted into the second hole portion so that a second end surface of the optical waveguide film in the optical waveguide direction and a second end surface of the second optical path converting part in the optical waveguide direction are optically coupled.

BRIEF DESCRIPTION OF THE DRAWINGS

Exemplary embodiments of the present invention will be described in detail based on the following figures, wherein.

DETAILED DESCRIPTION OF THE INVENTION

Hereinafter, referring to the drawings, one example of an exemplary embodiment of the present invention is described in detail.

[Optical Reception and Transmission Module]

Figure 1:
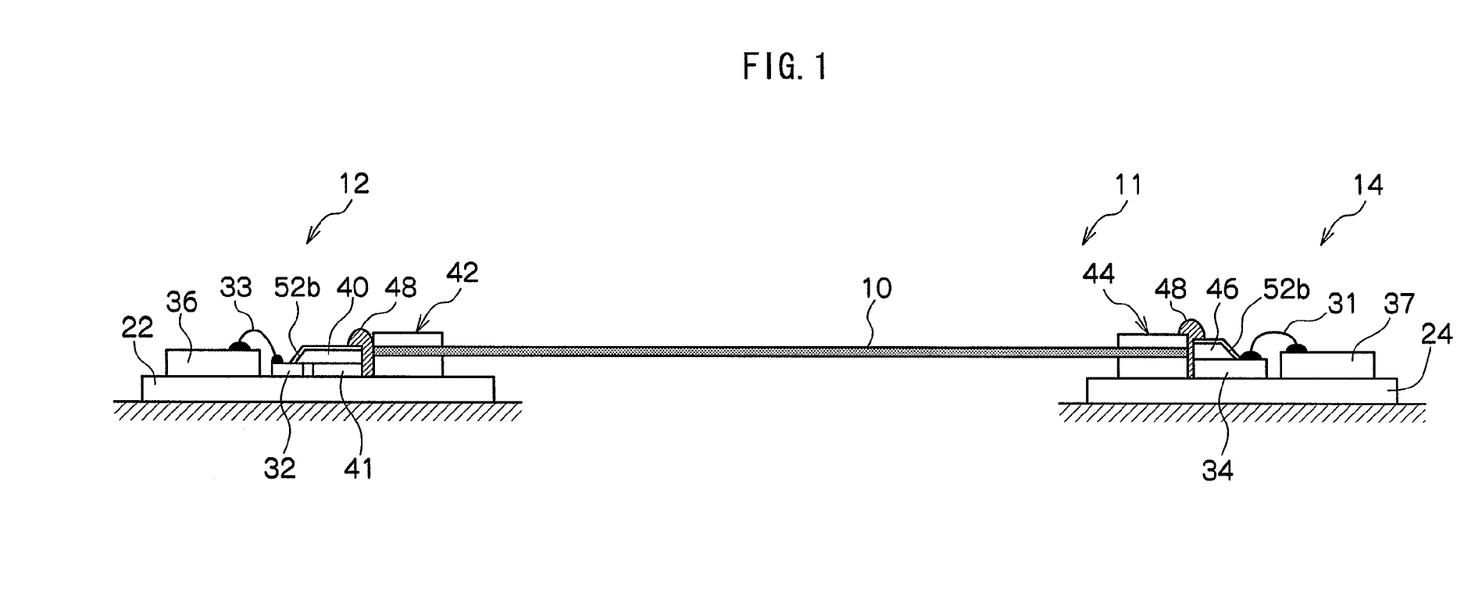
FIG. 1 is a schematic constitutional diagram of an optical reception and transmission module according to the exemplary embodiment.

FIG. 1 is a schematic constitutional diagram of an optical reception and transmission module according to the exemplary embodiment. As shown in FIG. 1, an optical reception and transmission module 11 is made up of a belt-like optical waveguide film 10, an optical transmission unit 12 that transmits an optical signal through an optical waveguide formed in the optical waveguide film 10, and an optical reception unit 14 that receives the optical signal.

While in the exemplary embodiment, a case where the optical transmission unit 12 transmits the optical signal, and the optical reception unit 14 receives the optical signal is described, a constitution may also be employed in which the optical transmission unit 12 has a function of transmitting and receiving the optical signal, and the optical reception unit 14 has a function of receiving and transmitting the optical signal. In this case, for example, a constitution may be such that a light emitting element and a light receiving element are provided in each of the optical transmission unit 12 and the optical reception unit 14, and that the optical waveguide film 10 includes a plurality of cores.

The optical transmission unit 12 includes a first holding member 22 for holding various members. In this first holding member 22, a light emitting element 32, a driving circuit 36 for driving the light emitting element 32, a first optical path converting part 40, and a first supporting member 42 are provided.

The optical reception unit 14 includes a second holding member 24 for holding various members. In this second holding member 24, a light receiving element 34, an amplifying circuit 37 for amplifying an optical signal obtained by photoelectric-converting light received by the light receiving element 34, a second optical path conversing part 46, and a second supporting member 44 are provided.

Figure 2A:
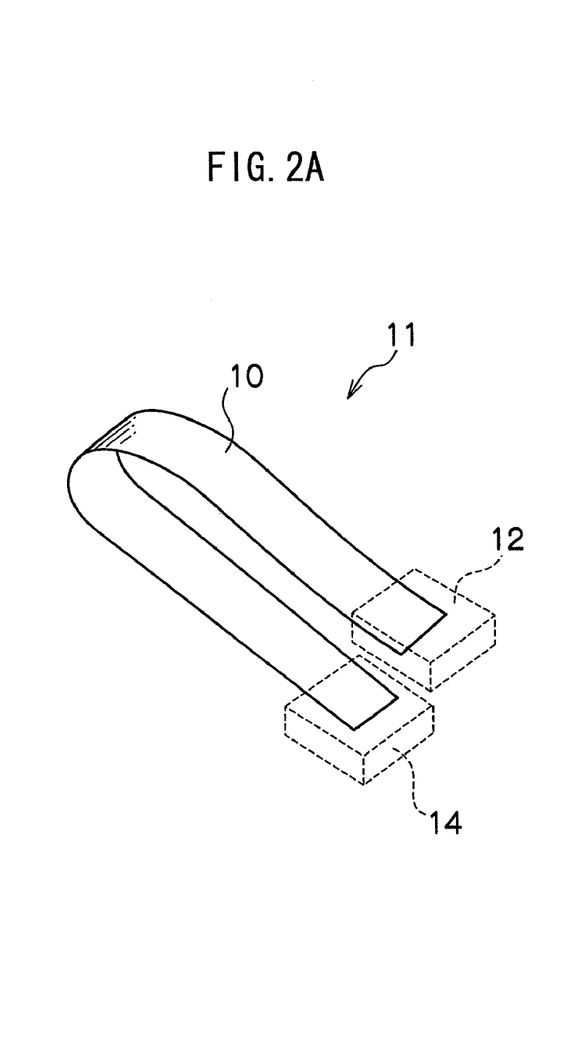
FIGS. 2A and 2B are diagrams showing a following property to deformation of the optical reception and transmission module according to the exemplary embodiment.
Figure 2B:
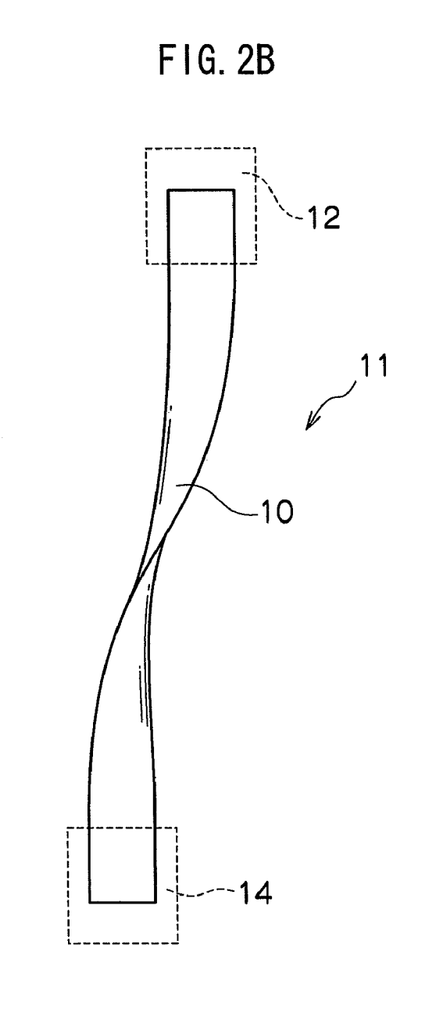

The optical waveguide film 10 is made of a transparent resin film having flexibility, and has a following property to deformation such as "folding", and "twisting", as shown in FIGS. 2A and 2B. Therefore, even in a state where the film is deformed, the optical signal transmitted from the optical transmission unit 12 is guided through the optical waveguide formed in the optical waveguide film 10 to be received by the optical reception unit 14. The optical waveguide film 10 preferably has a flexibility with a minimum bending radius of 3 mm or less.

If a minute portion of a curve formed inside of the optical waveguide film 10 when the optical waveguide film 10 is folded is approximated by a circle, the minimum bending radius is a value representing a minimum radius of the circle, and an acceptable value of the minimum bending radius is measured in accordance with ASTM D-2176.

For the optical waveguide film 10, a thickness thereof is preferably set to a range of 50 µm or more and 300 µm or less, more preferably a range of 50 µm or more and 200 µm or less in order to improve the following property to deformation. For the same reason, a width of the optical waveguide film 10 is preferably set to a range of 0.25 mm or more and 10 mm or less, more preferably a range of 0.25 mm or more and 5 mm or less.

In the optical waveguide film 10, one core 18 is surrounded by a clad 20, as shown in FIGS. 3A to 3C and FIGS. 4A to 4C. While in the exemplary embodiment, a case where the one core 18 is provided in the optical waveguide film 10 is described for simplification of the description, a constitution in which a plurality of cores 18 are provided may be employed. In this case, the constitution may be such that the plurality of cores 18 are surrounded by the clad 20 so as to be parallel to one another in the same plane parallel to a principal plane of the optical waveguide film 10.

The principal plane denotes a surface perpendicular to a layered direction (thickness direction of the optical waveguide film 10) of the core 18, and a lower clad 20a and an upper clad 20b layered so as to sandwich the core 18 in surface of the optical waveguide film 10.

Materials for the core 18 and the clad 20 of the optical waveguide film 10 according to the exemplary embodiment are not particularly limited, as long as they are transparent with respect to a wavelength to be used for the optical waveguide film 10, and allow a desired refractive index difference between the core 18 and the clad 20 to be set. While for example, an alicyclic olefin resin, an acrylic-based resin, an epoxy-based resin, a polyimide-based resin, and the like are used, in order to obtain favorable adhesiveness to a fire-resistant resin layer 13 made of a fire-resistant resin covering a surface, an acrylic-based resin or an epoxy-based resin are preferably used in at least a region in contact with this fire-resistant resin layer 13.

However, in order to exert optical properties as the optical waveguide, each of the clad 20 needs to be made of a material having a refractive index lower than that of the core 18, and particularly in order to ensure a refractive index difference from the core 18, the refractive index difference is preferably set to 2% or more and 5% or less, more preferably to 3% or more and 4% or less.

For example, if the refractive index difference between the clad 20 and the core 18 is 3%, the optical waveguide film 10 having little bending loss until a minimum curvature radius becomes 1.5 mm when the optical waveguide film 10 is bent will be formed. As this refractive index difference is larger, the optical waveguide film 10 having smaller optical loss when it is bent may be obtained. However, taking into consideration high bending performance of the optical waveguide film 10, optical connection loss to each of the light emitting element 32 and the light receiving element 34, and the like, the refractive index difference is preferably in the above-mentioned range.

Figure 4A:
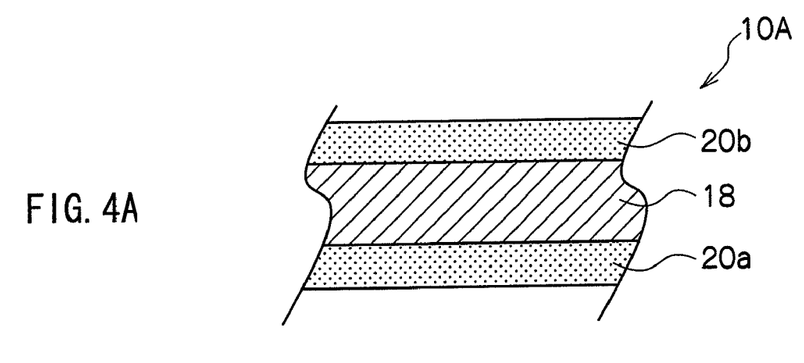
FIGS. 4A to 4C are schematic diagrams showing one example of a manufacturing process of the optical waveguide film of the optical reception and transmission module according to the exemplary embodiment.
Figure 4B:
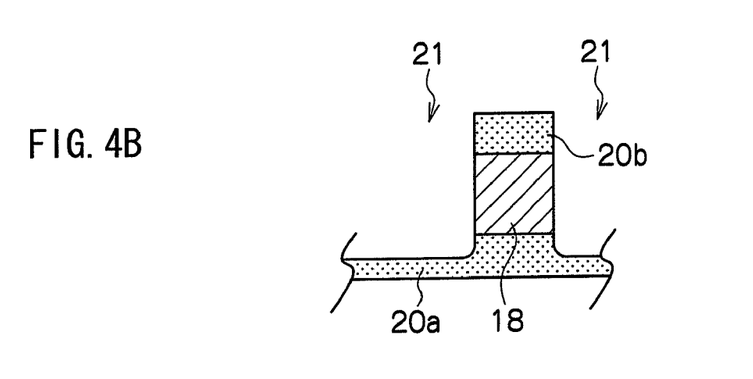
Figure 4C:
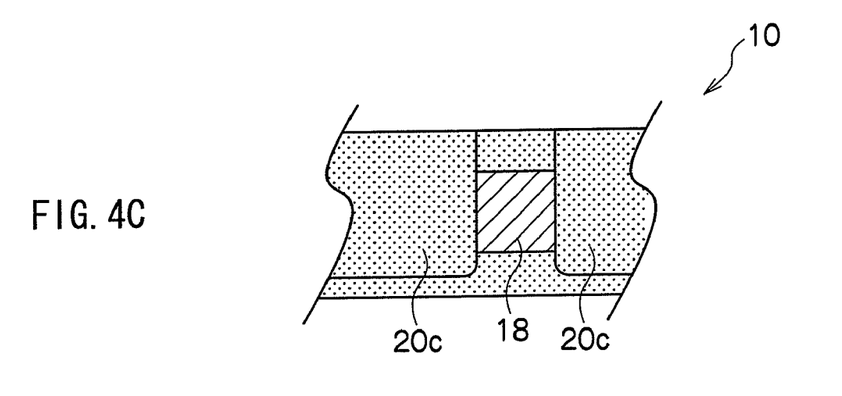

While a method for manufacturing the optical waveguide film 10 according to the exemplary embodiment is not particularly limited, for example, by a manufacturing process as shown in FIGS. 4A to 4C, it is manufactured with ease and at high precision.

First, as shown in FIG. 4A, a layered body 10A having the core 18, and the lower clad 20a and the upper clad 20b layered so as to sandwich the core 18 is prepared. For example, the lower clad 20a, the core 18, and the upper clad 20b are sequentially layered on a flat substrate (not shown) of glass, silicon or the like. A method for layering the respective layers is not particularly limited, as long as they are layered integrally so as not to cause peeling between the respective layers. For example, a publicly known method such as a lamination process and spin coating is employed.

A material making the lower clad 20a is not particularly limited, as long as it allows the refractive index difference from the core 18 to be set, and according to its application, a selection of the material is made in view of a refractive index, optical properties such as optical transparency, mechanical strength, heat resistance, flexibility and the like of the material. For example, a radiation curable, electron beam curable, or thermosetting resin, desirably an ultraviolet curable resin or a thermosetting resin is selected, and an ultraviolet curable or thermosetting monomer or oligomer, or a mixture of the monomer and the oligomer is desirably used. More desirably, an ultraviolet curable resin is selected.

As a specific material making the lower clad 20a, for example, an epoxy-based resin, an acrylic-based resin (polymethylmethacrylate or the like), an alicyclic acrylic resin, styrene-based resin (polystyrene, acrylonitrile styrene copolymer or the like), an olefin-based resin (polyethylene, polypropylene, ethylene propylene copolymer or the like), an alicyclic olefin resin, a vinyl chloride-based resin, a vinylidene chloride-based resin, a vinyl alcohol-based resin, a vinyl butyral-based resin, an arylate-based resin, a fluorine-containing resin, a polyester-based resin (polyethylene terephthalate, polyethylene naphthalate or the like), a polycarbonate-based resin, cellulose diacetate or cellulose triacetate, an amide-based resin (fatty series, aromatic polyamide or the like), an imide-based resin, a sulfone-based resin, a polyether sulfone-based resin, a polyether ether ketone-based resin, a polyphenylene sulfide-based resin, a polyoxymethylene-based resin, a blend of the resins, and the like are cited.

The lower clad 20a may, for example, be formed by delivering a liquid resin selected from the materials by drops onto a substrate of glass or the like, and applying spin coating to obtain a uniform thickness, and then curing the resultant, or a preformed resin film may be used for forming the lower clad 20a.

Although a thickness of the lower clad 20a is not particularly limited, it is desirably 10 μm or more, and 100 μm or less, more preferably 20 μm or more and 50 μm or less in view of optical properties, flexible performance, cutting workability, strength and the like which will be described later.

For the core 18, for example, an ultraviolet curable resin is used, and an ultraviolet curable monomer, oligomer, or a mixture of the monomer and the oligomer is desirably used. As a specific material for core, an epoxy-based, acrylic-based ultraviolet curable resin or the like is desirably used.

For example, after a liquid resin of a curable resin for core (ultraviolet curable resin) is applied onto the lower clad 20a in a uniform thickness, ultraviolet rays are irradiated using an ultraviolet lamp, ultraviolet LED, UV irradiating device or the like to cure the resin, by which the core 18 is formed.

A thickness of the core 18 is not particularly limited, but may be set in accordance with its application, it is desirably 20 μm or more and 120 μm or less, more desirably 30 μm or more and 90 μm or less in view of optical performance, flexible performance, cutting workability and strength and the like, which will be described later.

For the upper clad 20b, while a material thereof is not particularly limited, as long as the above-mentioned refractive index difference from the core 18 may be set, the same material as that of the lower clad 20a is desirably used. For example, the same liquid resin as that of the lower clad 20a is applied onto the core 18 in a uniform thickness, and then the resultant is cured, by which the upper clad 20b is formed.

A thickness of the upper clad 20b is desirably 5 μm or more and 100 μm or less, more desirably 10 μm or more and 50 μm or less in view of optical performance, flexible performance, cutting workability, strength and the like, which will be described later.

The lower clad 20a and the upper clad 20b do not need to be the same in thickness, and for example, a thickness of the upper clad 20b may be made thinner than that of the lower clad 20a to keep a total thickness of the layered body 10A smaller.

Moreover, the size and the total thickness of the layered body 10A are not particularly limited, but may be set appropriately in accordance with the materials, application and the like. However, for example, in order to make the optical waveguide film 10 flexible, the thickness of the layered body 10A is desirably 50 μm or more and 300 μm or less, more desirably 50 μm or more and 200 μm or less. On the other hand, a width of the layered body 10A is desirably 0.25 mm or more and 10 mm or less, more desirably 0.25 mm or more and 5 mm or less. Setting the thickness and the width of the optical waveguide film 10 to the above-mentioned ranges makes it easier to ensure the flexibility and the strength as an optical waveguide.

Next, as shown in FIG. 4B, portions of the layered body 10A are removed by cutting using a dicing saw or the like, and the removed portions (cut grooves 21) are buried with the resin for clad having a lower refractive index than that of the core 18. For example, as shown in FIG. 4C, by causing the curable resin for clad to flow into the cut grooves 21 formed on the layered body 10A, and curing the same, the buried clads 20c are formed. Also, while the buried clads 20c are not particularly limited, as long as a material thereof allows the above-mentioned refractive index difference from the core 18 to be set, the same material as that of the lower clad 20a is desirably used. For example, by delivering the curable resin for clad by drops on the principal plane side, and spreading the same by centrifugal force in a spin coating process, the inside of each of the cut grooves 21 is filled with the curable resin for clad. The method for applying the curable resin for clad is not limited to the spin coating process, but, for example, a method may also be employed in which the curable resin for clad is pressed by a glass substrate or the like while controlling a film thickness by a spacer to be cured by exposure.

Figure 3A:
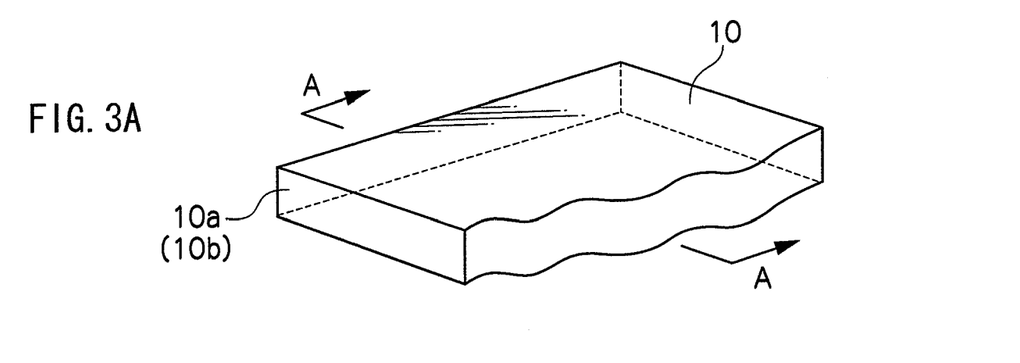
FIG. 3A is a perspective diagram of an end portion of the optical waveguide film of the optical reception and transmission module according to the exemplary embodiment.
Figure 3B:
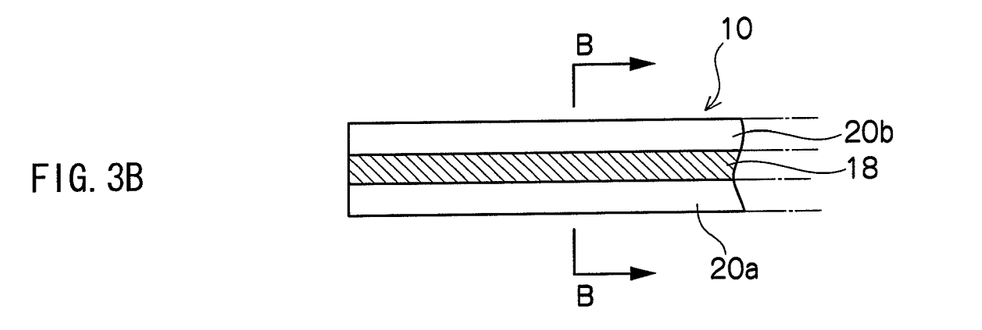
FIG. 3B is a cross-sectional diagram taken along A-A in FIG. 3A.
Figure 3C:
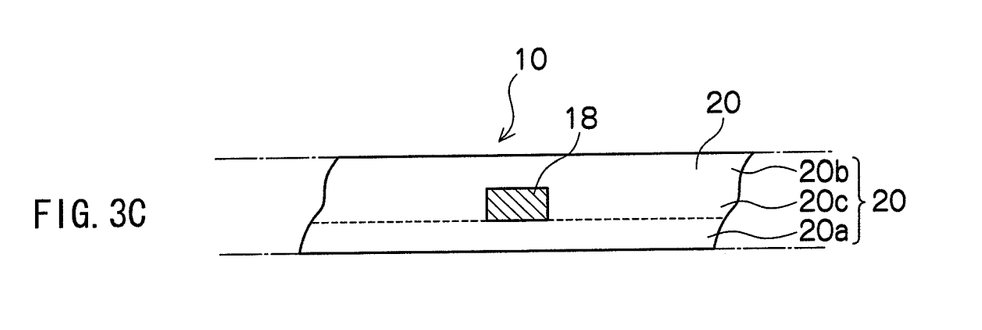
FIG. 3C is a cross-sectional diagram taken along B-B in FIG. 3B.

As shown in FIG. 3, both end portions of the optical waveguide film 10 in an optical waveguide direction are cut in a direction perpendicular to the optical waveguide direction. Light enters the core 18 of the optical waveguide film 10 from this cut surface (hereinafter, first end surface 10a in the optical waveguide direction, and the second end surface 10b in the optical waveguide direction), that is, first end surface of the core 18 (cut surface) in the optical waveguide direction, and this incident light is guided through the core 18 of the optical waveguide film 10 to exit from the second end surface (cut surface) of the core 18.

Figure 5A:
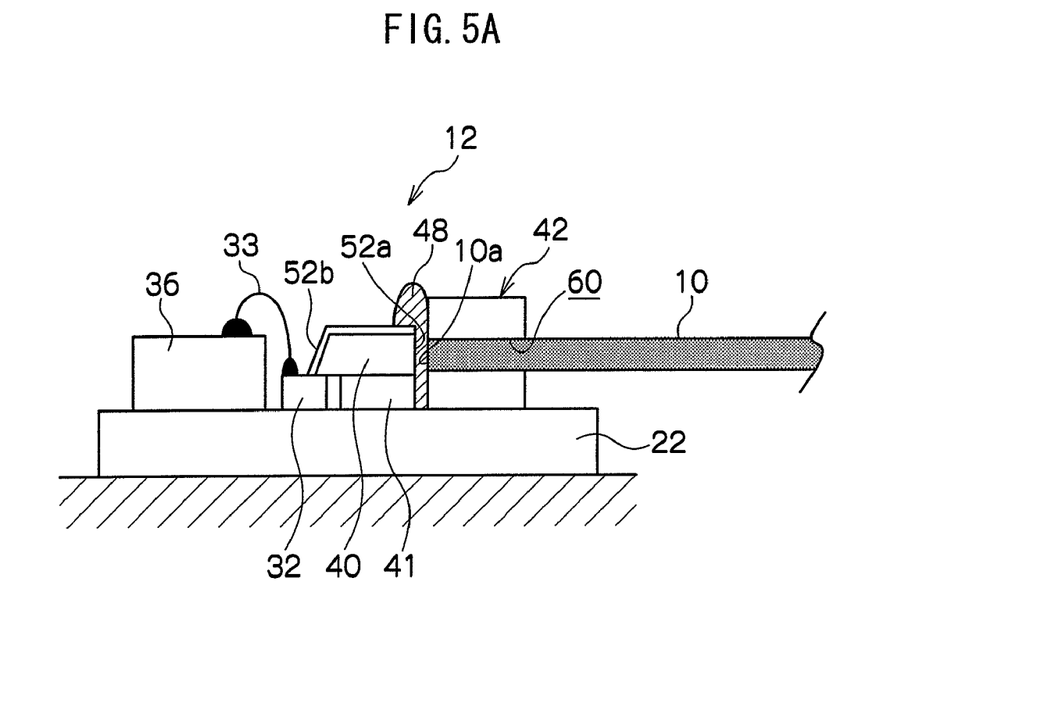
FIGS. 5A and 5B are schematic diagrams in which an optical transmission unit and an optical reception unit of the optical reception and transmission module according to the exemplary embodiment are enlarged, respectively.

As shown in FIG. 5A, the optical transmission unit 12 includes the first holding member 22 for holding various members. The first holding member 22 is made of a substantially rectangular parallelepiped substrate. In this first holding member 22, the light emitting element 32, the driving circuit 36, the first optical path converting part 40, and the first supporting member 42 are provided.

This light emitting element 32 and the driving circuit 36 are electrically connected by wiring 33. As the light emitting element 32, a surface light emitting element is used. In many cases, the light emitting element 32 is thinner than the light receiving element 34 provided in the light reception unit 14, and thus, for height alignment, a positioning spacer 41 made of a silicon material or the like is preferably arranged between the first optical path converting part 40 and the first holding member 22.

While in the exemplary embodiment, a case where the driving circuit 36 is provided on the first holding member 22 is described, a constitution may also be employed in which the driving circuit 36 is provided as a separate body from the optical transmission unit 12 instead of being held by the first holding member 22.

Similarly, while in the exemplary embodiment, a case where the first supporting member 42 is held on the first holding member 22 is described, the first supporting member 42 only needs to be constituted so that the light emitted from the light emitting element 32 is guided to the optical waveguide film 10 supported by the first supporting member 42, and the constitution thereof is not limited to the constitution in which the first supporting member 42 is held by the first holding member 22.

Figure 5B:
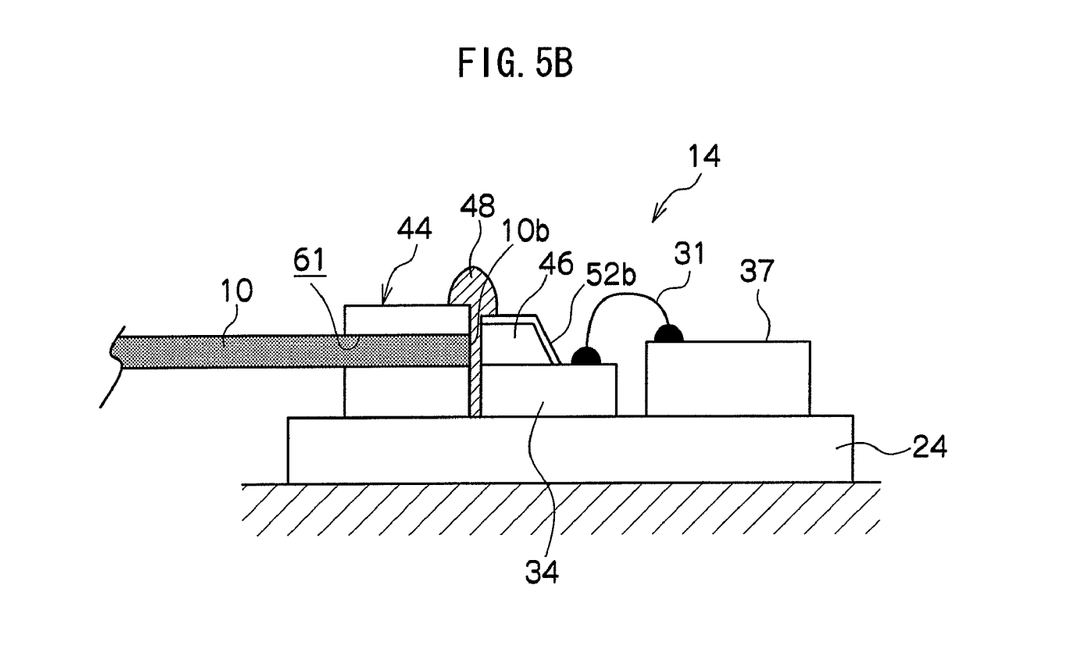

As shown in FIG. 5B, the optical reception unit 14 includes the second holding member 24 for holding the various members, as described above. The second holding member 24 is made of a substantially rectangular parallelepiped substrate. In this second holding member 24, the light receiving element 34, the amplifying circuit 37, the second optical path converting part 46, and the second supporting member 44 are provided. This light receiving element 34 and the amplifying circuit 37 are electrically connected through wiring 31. As a light receiving element 34, a surface light receiving element is used.

While in the exemplary embodiment, a case where as in the first holding member 22, the amplifying circuit 37 is provided on the second holding member 24 is described, a constitution may also be employed in which the amplifying circuit 37 is provided as a separate body from the optical reception unit 14 instead of being held by the second holding member 24.

Similarly, while in the exemplary embodiment, a case where the second supporting member 44 is held on the second holding member 24 is described, the second supporting member 44 only needs to be constituted so that the light guided through the optical waveguide film 10 supported by the second supporting member 44 is received in the receiving element 34, and the constitution is not limited to the constitution in which the second supporting member 44 is held by the second holding member 24.

Figure 6:
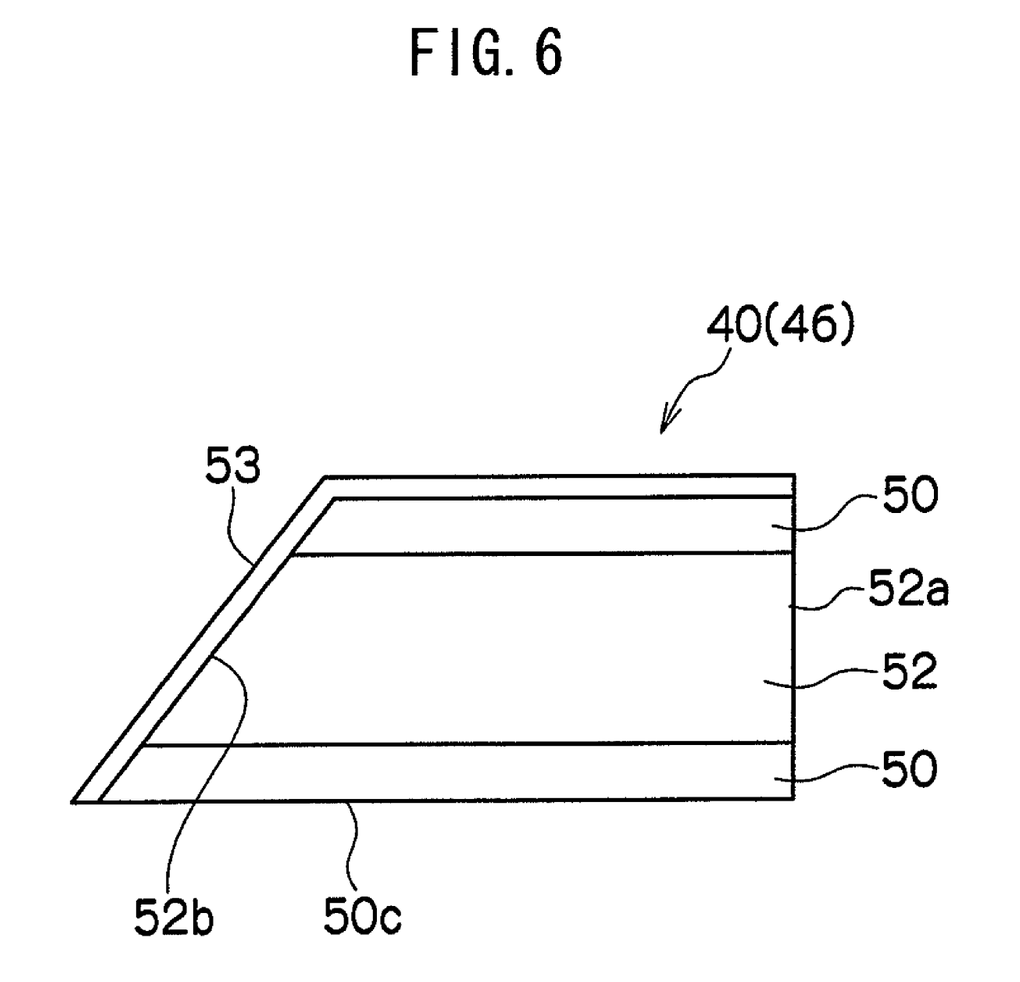
FIG. 6 is a schematic diagram showing a first optical path converting part and a second optical path converting part according to the exemplary embodiment.

Each of the first optical path converting part 40 and the second optical path converting part 46 are constituted so that a core 52 is surrounded by a clad 50 as shown in FIG. 6. In the exemplary embodiment, since the case where the one core 18 is provided in the optical waveguide film 10 is described, a constitution is employed in which the one core 52 is formed for each of the first optical path converting part 40 and the second optical path converting part 46. However, in each of the first optical path converting part 40 and the second optical path converting part 46, cores of the same number and the same shape as those of the cores provided in the optical waveguide film 10 only need to be provided in the same pitch in corresponding positions, and the number of the cores is not limited to one. In the case where in each of the first optical path converting part 40 and the second optical path converting part 46, the plurality of cores 52 are provided, as in the case where the optical waveguide film has the plurality of cores 18, the constitution may be such that the plurality of cores 52 are surrounded by the clad 50 so as to be parallel to one another in the same plane parallel to each of principal planes of the first optical path converting part 40 and the second optical path converting part 46.

As shown in FIG. 6, a second end portion of each of the first optical path converting part 40 and the second optical path converting part 46 in the optical waveguide direction is a cut surface (hereinafter, referred to as a perpendicular cut surface) 52a perpendicular to the optical waveguide direction in the core 52, and in a first end portion, a mirror surface 52b having an angle of 45° with respect to an optical axis of the core 52 is formed. This mirror surface 52b serves as an optical path converting surface that converts an optical path of the light guided through the core 52. That is, in the first optical path converting part 40, the light emitted from the light emitting element 32 comes from a sheet surface 50c (incident end surface), and an optical path of this incident light is bent at 90° by the mirror surface 52b to be guided inside of the core 52 and emitted from the perpendicular cut surface 52a. The light emitted from this perpendicular cut surface 52a is guided to the optical waveguide film 10 through the end surface (the first end surface 10a in the optical waveguide direction) of the optical waveguide film 10 supported by the first supporting member 42. While here, the example in which an angle of the mirror surface 52b with respect to the optical axis of the core 52 is set to 45° to bend the incident light at 90° is cited, it is obvious that exactly setting to 45° and 90° respectively are not requisites, but the relation between the light receiving and emitting elements is adjusted appropriately to thereby carry out the invention. Although 90° is, of course, preferable in that the manufacturing becomes easier, it only needs to be in a range allowing for the light propagation instead of exactly setting to 90°.

On the other hand, in the second optical path converting part 46, the light guided through the optical waveguide film 10 supported by the second supporting member 44 is emitted from the end surface (the second end surface 10b in the optical waveguide direction) of the optical waveguide film 10, and this emitted light is guided through the core 52, and then, the optical path is bent at 90° by the mirror surface 52b to be emitted from a sheet surface 50c (emitting end surface) on the light emitting side. The emitted light is received by the light receiving element 34. The angles of the second optical path converting part 46 are the same as those of the first optical path converting part 40 in the foregoing.

In this mirror surface 52b, a metal film 53 is provided. For this metal film 53, gold, silver, copper and an alloy of any ones of these may be used. For the formation of the metal film 53 onto this mirror surface 52b, film deposition by a sputtering method, a vacuum deposition method or the like is used.

As a material forming the core 52 of each of the first optical path converting part 40 and the second optical path converting part 46 according to the exemplary embodiment, the same material of the core 18 of the optical waveguide film 10 is cited. Moreover, as a material forming the clad 50 of each of the first optical path converting part 40 and the second optical path converting part 46 according to the exemplary embodiment, the same material as that of the clad 20 of the optical waveguide film 10 is cited.

Since in the first optical path converting part 40 and the second optical path converting part 46, not so high bending performance as that of the optical waveguide film 10 is required, as a refractive index difference between the core 52 and the clad 50, the refractive index difference of 2% or more and 5% or less as in the optical waveguide film 10 is not necessarily required. However, it is preferable for reducing optical connection loss between each of the first optical path converting part 40 and the second optical path converting part 46, and the optical waveguide film 10 to select the materials of the core 52 and the clad 50 in each of the first optical path converting part 40 and the second optical path converting part 46 so that the same refractive index difference as that between the core 18 and the clad 20 in the optical waveguide film 10 is obtained.

The first optical path converting part 40 and the second optical path converting part 46 are connected with ease and at high precision using the above-described method for manufacturing the optical waveguide film 10. Since a similar manufacturing method to that of the optical waveguide film 10 is used, a detailed description of the manufacturing method is omitted.

The mirror surface 52b may be produced by dicing first end portion thereof in the optical waveguide direction using a 45° angled blade, and the metal film 53 may be provided on this mirror surface 52*b* as described above.

As shown in FIG. 5A, the first supporting member 42 has a hole portion 60 into which the end portion of the optical waveguide film 10 is inserted, so that it supports the end portion of the optical waveguide film 10 inserted into the hole portion 60. This first supporting member 42, in a state where it is mounted on the first holding member 22, supports the first end portion of the optical waveguide film 10 so that the first end surface 10*a* in the optical waveguide direction of the optical waveguide film 10 inserted into the hole portion 60 and the perpendicular cut surface 52*a* of the first optical path converting part 40 are optically coupled.

The hole portion 60 of this first supporting member 42 only needs to be shaped so as to be capable of supporting the first end portion of the optical waveguide film 10, and is preferably shaped to correspond to an outer periphery of the optical waveguide film 10. Moreover, in this hole portion 60, it is preferable that in the state the first supporting member 42 is mounted on the first holding member 22, an inner peripheral diameter thereof continuously becomes smaller as it becomes closer to the side of the perpendicular cut surface 52*a* of the first optical path converting part 40 and that a inner peripheral diameter is equal to or greater than an outer peripheral diameter of the optical waveguide film 10.

Similarly, the second supporting member 44, as shown in FIG. 5B, has a hole portion 61 into which the end portion of the optical waveguide film 10 is inserted, so that it supports the end portion of the optical waveguide film 10 inserted into the hole portion 61. This second supporting member 44, in a state where it is mounted on the second holding member 24, supports the second end portion of the optical waveguide film 10 so that the second end surface 10*b* of the optical waveguide film 10 in the optical waveguide direction inserted into the hole portion 61 and the perpendicular cut surface 52*b* of the second optical path converting part 46 are optically coupled.

Similar to the hole portion 60, the hole portion 61 of this second supporting member 44 only needs to be shaped so as to be capable of supporting the second end portion of the optical waveguide film 10, and is preferably shaped to correspond to the outer periphery of the optical waveguide film 10. Moreover, in this hole portion 61, it is preferable that in the state the second supporting member 44 is mounted on the second holding member 24, an inner peripheral diameter thereof continuously becomes smaller as it becomes closer to the side of the perpendicular cut surface 52*a* of the second optical path converting part 46, and that a inner peripheral diameter is equal to or greater than the outer peripheral diameter of the optical waveguide film 10.

The first supporting member 42 and the second supporting member 44 have the same constitution as described above, and are manufactured using the same manufacturing method. As a manufacturing method of this first supporting member 42 and the second supporting member 44, a method similar to a manufacturing process of a semiconductor is used because large numbers of the first supporting members 42 and the second supporting members 44 are manufactured at high precision at once.

Figure 7A:
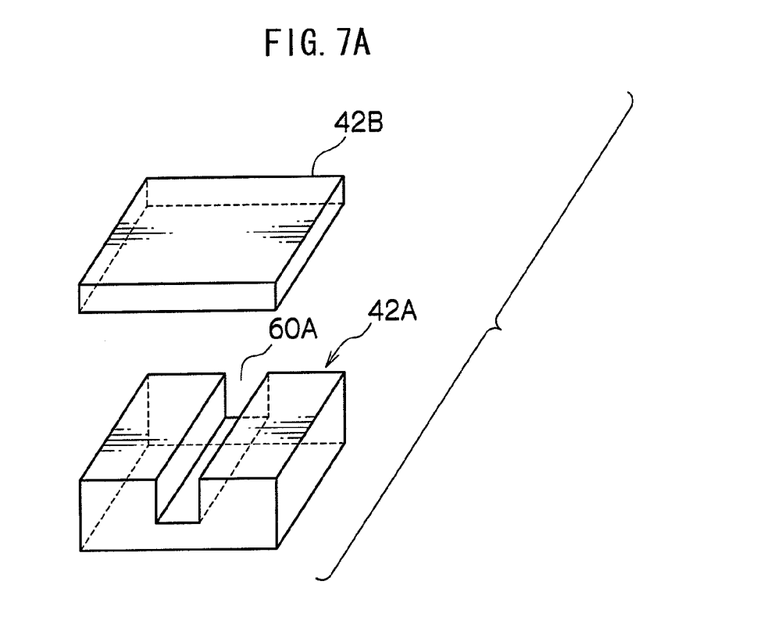
FIGS. 7A and 7B are schematic diagrams showing one example of a manufacturing process of a first supporting member and a second supporting member according to the exemplary embodiment.
Figure 7B:
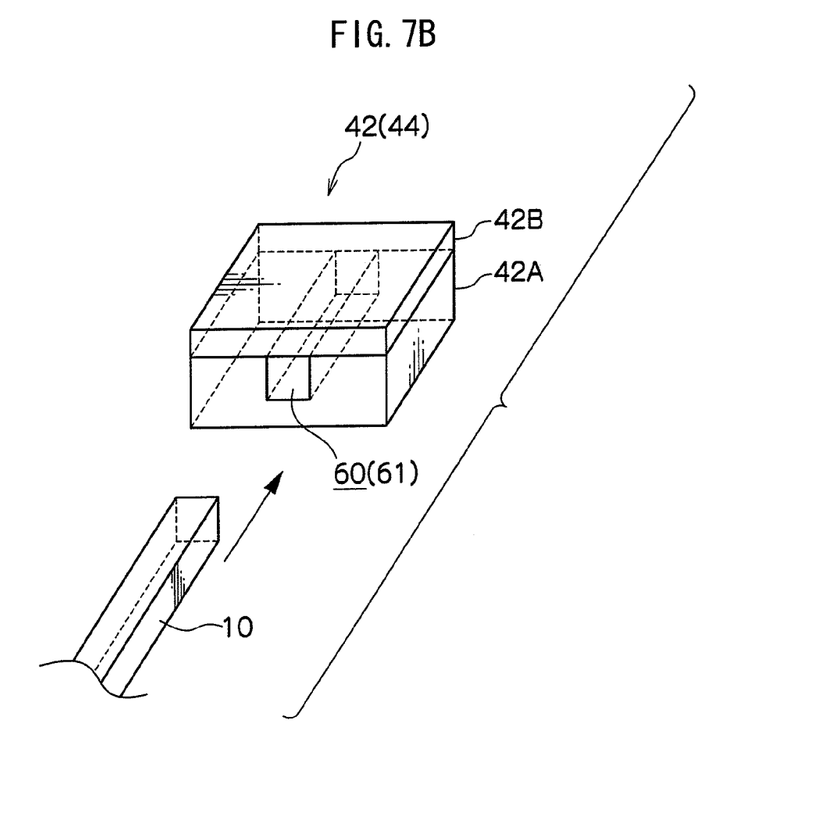

More specifically, as shown in FIG. 7A, a flat plate-like second member 42B is layered on a first member 42A provided with a groove portion 60A corresponding to the hole portion 60 or the hole portion 61 to thereby manufacture each of the first and second supporting members 42, 44.

This first member 42A is obtained by forming the groove portion 60A on a metal substrate of Si, Ni, and Cu or the like, or a glass substrate. The shape of this groove portion 60A is preferably a shape corresponding to the outer periphery of the optical waveguide film 10, and a V shape, U shape and the like are cited in accordance with the shape of the optical waveguide film 10. Moreover, for the formation of this groove portion 60A, a method such as a dicing saw, etching, or reactive ion etching is used.

By laying the second member 42B on the side of this first member 42A where the groove portion 60A is provided, each of the first supporting member 42 and the second supporting member 44 is obtained. For this second member 42B, a transparent member is preferably used, and a base material of glass, plastic or the like is used.

In the exemplary embodiment, "transparent", for example, denotes a property of transmitting light in a visible light region to some extent, and in the exemplary embodiment, the second member 42B may be at least enough transparent to visually confirm this inserted the optical waveguide film 10 through the second member 42B when the optical waveguide film 10 is inserted into the hole portion 60 or the hole portion 61.

As shown in FIG. 1, FIGS. 5A and 5B, and FIG. 7B, in the optical transmission unit 12, for example, the light emitting element 32 and the first supporting member 42 are mounted on the first holding member 22 using a flip-chip bonder or the like, and then the first optical path converting part 40 is mounted on the light emitting element 32 using the flip-chip bonder. At this time, the first optical path converting part 40 and the first supporting member 42 are mounted so that an opening on the side of the hole portion 60 of the first supporting member 42 where the inner peripheral diameter is smaller faces the perpendicular cut surface 52*a* of the first optical path converting part 40, and that the light irradiated from the light emitting element 32 to the mirror surface 52*b* through the sheet surface 50*c* of the first optical path converting part 40 is coupled to the opening on the side of the hole portion 60.

For the adhesion of these members to the first holding member 22, for example, an epoxy-based ultraviolet curable resin or the like is used to cause them to adhere by UV irradiation. In the case where the driving circuit 36 is mounted on the first holding member 22, the driving circuit 36 is also mounted on the first holding member 22, and this driving circuit 36 and the light emitting element 32 are electrically connected by the wiring 33.

Next, the first end portion of the optical waveguide film 10 is inserted into the hole portion 60 of the first supporting member 42 mounted on the first holding member 22 from the side of the hole portion 60 where the inner peripheral diameter is larger. And the first end portion of the optical waveguide film 10 is inserted into the hole portion 60 of the first supporting member 42 until an opening surface by the hole portion 60 of the first supporting member 42 and the first end surface (first end surface 10*a* in the optical waveguide direction) of the optical waveguide film 10 become coplanar, or until the first end surface of the optical waveguide film 10 passes the opening surface to abut against the perpendicular cut surface 52*a* of the first optical path converting part 40.

An epoxy-based ultraviolet curable resin 48 for core is applied between the first optical path converting part 40, and the optical waveguide film 10 supported by the first supporting member 42, and then is subjected to UV irradiation to thereby fix the first end portion side of the optical waveguide film 10 to the optical transmission unit 12.

This epoxy-based ultraviolet curable resin 48 for core is a resin of the same material as the material that makes up the core 18 of the optical waveguide film 10. This restrains light loss between the optical waveguide film 10 and the first optical path converting part 40.

Also, for the optical reception unit 14, similar to the optical transmission unit 12, for example, the light receiving element 34 and the second supporting member 44 are mounted on the second holding member 24 using a flip-chip bonder or the like, and then the second optical path converting part 46 is mounted on the light receiving element 34 using the flop-chip bonder. At this time, the second optical path converting part 46 and the second supporting member 44 are mounted so that an opening on the side of the hole portion 61 of the second supporting member 44 where the inner peripheral diameter is smaller faces the perpendicular cut surface 52a of the second optical path converting part 46, and that an optical path of the light guided through the core 52 of the second optical path converting part 46 is converted by the mirror surface 52b of the second optical path converting part 46 and that the light reaches the light receiving element 34 through the sheet surface 50c of the second optical path converting part 46.

For the adhesion of these members to the second holding member 24, for example, an epoxy-based ultraviolet curable resin or the like is used to cause them to adhere by UV irradiation. In the case where the amplifying circuit 37 is mounted on the second holding member 24, the amplifying circuit 37 is also mounted on the second holding member 24, and this amplifying circuit 37 and the light receiving element 34 are electrically connected by the wiring 31.

Next, the second end portion of the optical waveguide film 10 is inserted into the hole portion 61 of the second supporting member 44 mounted on the second holding member 24 from the side of the hole portion 61 where the inner peripheral diameter is larger. And the second end portion of the optical waveguide film 10 is inserted until an opening surface by the hole portion 61 of the second supporting member 44 and the second end surface of the optical waveguide film 10 become coplanar, or until the second end surface of the optical waveguide film 10 passes the opening surface to abut against the perpendicular cut surface 52a of the second optical path converting part 46.

The epoxy-based ultraviolet curable resin 48 for core is applied between the second optical path converting part 46 and the optical waveguide film 10 supported by the second supporting member 44, and then is subjected to UV irradiation to thereby fix the second end portion side of the optical waveguide film 10 to the optical reception unit 14.

In this manner, the optical reception and transmission module 11 is formed.

In order to improve fire resistance of the optical reception and transmission module 11, a constitution may be employed in which a fire-resistant resin covers the module, so that a fire-resistant resin layer 13 is provided on a surface thereof.

Figure 8:
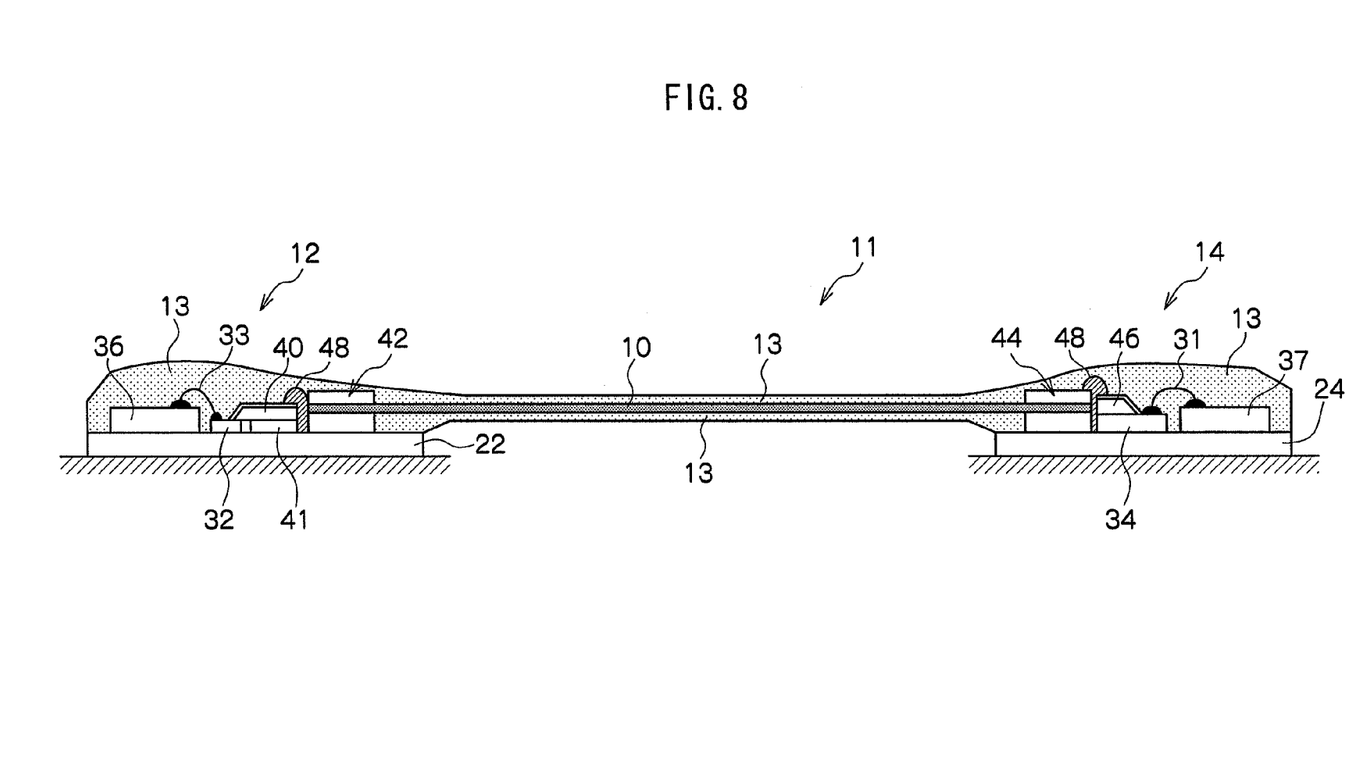
FIG. 8 is a schematic diagram showing the optical reception and transmission module covered with a fire-resistant resin.

For the fire-resistant resin layer 13, for example, using a dispenser, the fire-resistant resin may be applied to surfaces of the optical waveguide film 10, the driving circuit 36, the light emitting element 32, the first optical path converting part 40, the first supporting member 42, the second supporting member 44, the second optical path converting part 46, the light receiving element 34, and the amplifying circuit 37 to thereby form the fire-resistant resin layer 13 made of the fire-resistant resin on these surfaces, as shown in FIG. 8.

UL94 test of the fire-resistant resin is a publicly known burning test that is conducted using a strip specimen having a width of 13.0 mm, a length of 125 mm, and a thickness of 100 µm, which is an actually minimum value, and examines an extent of burning of the specimen by applying a flame of a gas burner in a vertical burning test or a horizontal burning test. As classes of fire resistance of general materials based on this UL94, there are 5VA, 5VB, V-0, V-1, V-2 and HB in order from high fire resistance. The fire-resistant resin of the exemplary embodiment has fire resistance of HB or more according to this UL 94 test, preferably V-2 or more, more preferably V-0 or more, when it is formed as the fire-resistant resin layer.

As a fire-resistant resin having the property, in the exemplary embodiment, a resin consisting essentially of dimethylpolysiloxane (HO—[Si(CH$_3$)$_2$O]N—H) having a polymerization degree of 200 to 1000 is used. The fire-resistant resin consisting essentially of dimethylpolysiloxane means that it contains 30% by weight or more of the dimethylpolysiloxane.

It is known that dimethylpolysiloxane obtained in an ordinary manufacturing process contains traces of cyclic dimethylpolysiloxane, and this cyclic dimethylpolysiloxane, being unreactive and volatile, may cause an electric contact fault.

Consequently, in the exemplary embodiment, there is used a fire-resistant resin in which a content of low-molecular siloxane having a cyclic dimethyl type (D form) bond content of D3 (trimer) to D20 (20-mer) is 500 ppm or less, preferably 300 ppm or less.

This fire-resistant resin preferably contains a filler having fire resistance (fire-resistant filler). As the fire-resistant filler, titanium oxide, silicon oxide, aluminum oxide and the like are cited.

In the case where the fire-resistant resin contains the fire-resistant filler, a compounding amount of the fire-resistant filler based on 100 parts by weight of dimethylpolysiloxane is preferably in a range of 1 to 70 parts by weight.

This fire-resistant resin is applied to the members to be covered, and then, is cured by being left at a room temperature, being heated or the like, and thereby it is provided on the surfaces of the members as the fire-resistant resin layer 13. For the application of this fire-resistant resin, a dispenser or the like is used. Therefore, a viscosity of the fire-resistant resin during application needs to be sufficiently low. More specifically, it is 1 Pa·s or more and 30 Pa·s or less, preferably 2 Pa·s or more and 20 Pa·s or less. A material may be added for adjusting the viscosity to such an extent as not to exert an adverse effect.

A thickness of the fire-resistant resin layer 13 formed by applying the fire-resistant resin to the various members and then, curing the same is 20 µm or more and 100 µm or less, preferably 30 µm or more and 80 µm or less in a linear portion requiring bending performance. In the first holding member 22 and the second holding member 24 not requiring bending performance, since wires of wiring electrodes and the like need to be all covered, the thickness is determined in each case.

A tensile strength of this fire-resistant resin layer 13 is 0.5 MPa or more and 5 MPa or less, preferably 1.0 MPa or more and 4.0 MPa or less.

The measurement of the tensile strength and viscosity is conducted in conformity with JIS-K6249.

In the case where a constitution is employed in which the fire-resistant resin layer 13 is provided on the surface of the optical waveguide film 10, a total thickness of the fire-resistant resin layer 13 and the optical waveguide film 10 is preferably in a range of 50 µm or more and 500 µm or less, more preferably in a range of 100 µm or more and 300 µm or less in order to improve the following property to the deformation. For the same reason, a total width of the fire-resistant resin layer 13 and the optical waveguide film 10 is preferably in a range of 0.25 mm or more and 10 mm or less, more preferably in a range of 0.3 mm or more and 5 mm or less.

By the process, the optical reception and transmission module 11 in which the surfaces of the respective members making up the optical reception and transmission module 11 are covered with the fire-resistant resin is manufactured.

Hereinafter, while the invention is specifically described in reference to examples, the invention is not limited to these examples.

EXAMPLE 1

<Manufacturing of Optical Waveguide Film>

First, an epoxy-based film (thickness: 50 μm, refractive index: 1.57) having a high refractive index to serve as a core is prepared. Next, an epoxy-based ultraviolet curable resin having a refractive index of 1.51 is applied to both surfaces of this epoxy-based film having the high refractive index as the core by spin coating in a thickness of 20 μm, and is irradiated with ultraviolet rays to be cured, by which a three-layered film is obtained.

The three-layered film is placed in a dicing saw (trade name: DAD321, manufactured by DISCO Corporation), and using the dicing saw to which a blade having a thickness of 100 μm is attached, the film is cut from a principal surface (top surface) side at a precision of 75 μm±5 μm. Next, by moving 50 μm to cut the same, a projected portion corresponding to the core having a core diameter of 50 μm is formed. Next, by moving 450 μm to cut the same, and further moving 50 μm to cut the same, a duplex core having a core diameter of 50 μm and a pitch of 500 μm is formed.

Next, the epoxy-based ultraviolet curable resin having the refractive index of 1.51 is applied to the cut recessed portion so as to be buried therein, and then is irradiated with ultraviolet rays to be cured. Further, using the dicing saw, both end portions of the core in an extending direction is cut perpendicularly to the extending direction, by which an optical waveguide film having a thickness of 90 μm, a length of 100 mm, and a width of 1 mm is manufactured.

<Manufacturing of Optical Path Converting Part>

Two Arton films (thickness: 50 μm, refractive index: 1.51) to serve as a core are prepared. Next, an epoxy-based ultraviolet curable resin having a refractive index of 1.57 is sandwiched by these two Arton films, and that the resultant is fixed with a spacer interposed so that a thickness of the ultraviolet curable resin is 50 μm and a total thickness of these three layers is 150 μm. Next, ultraviolet rays are irradiated to cure the ultraviolet curable resin, by which a three-layered film in which a core layer has a thickness of 50 μm and clad layers has a thickness of 50 μm is manufactured.

Subsequently, the three-layered film is placed in a dicing saw (trade name: DAD321, manufactured by DISCO Corporation), and using the dicing saw to which a blade having a thickness of 100 μm is attached, the film is cut from a principal surface (top surface) side at a precision of 110 μm±5 μm. Next, by moving 50 μm to cut the same, a projected portion corresponding to the core having a core diameter of 50 μm is formed. Next, by moving 450 μm to cut the same, and further moving 50 μm to cut the same, a duplex core having a core diameter of 50 μm and a pitch of 500 μm is formed.

Next, the epoxy-based ultraviolet curable resin having the refractive index of 1.51 is applied to the cut recessed portion so as to be buried therein, and then is irradiated with ultraviolet rays to be cured. Further, using a dicing saw with a 45° angled blade, first end portion of this film is cut at an angle of 45° with respect to an optical axis to expose the core having a 45° mirror surface. Next, the second end portion is cut perpendicular to the optical axis, so that an optical path converting part with a perpendicular cut surface on the second end side is obtained. Furthermore, for this mirror surface, an Ag alloy film is deposited in a thickness of 100 nm by sputtering of an Ag alloy to manufacture a metal film. Finally, dicing is performed using an ordinary blade to thereby manufacture an optical path converting part having a thickness of 150 μm, a length of 500 μm, and a width of 1 mm, in which a metal film is provided on the 45° mirror surface in the first end portion, and the second end portion thereof is a perpendicular cut surface.

<Manufacturing of Supporting Member>

For a supporting member, a recessed groove having a width of 1 mm and a depth of 90 μm is formed by reactive ion etching in a 5-inch sized Si wafer, which grinded so as to have a thickness of 200 μm, and then, a 5-inch sized Arton film (manufactured by JSR Corporation) having a thickness 100 μm is caused to adhere to a surface on the side where this recessed groove is provided to manufacture a laminated structure.

Thereafter, using the dicing saw, the laminated structure is cut in a direction perpendicular to an extending direction of a hole corresponding to the recessed groove at intervals of 1 mm, and is cut so that the recessed groove is centrally located and a width thereof becomes 1.5 mm, by which supporting members (length: 1 mm, width: 1.5 mm, height: 300 μm) having a hole portion having a length and a width of 1 mm and a height 90 μm are manufactured.

<Mounting on Module>

A VCSEL element (trade name: AM-0001, manufactured by Fuji Xerox Co., Ltd), and a photodiode element (trade name: D8485-1026, manufactured by EMCORE Corporation) are placed on a silicon substrate having a thickness of 600 nm to be mounted on the silicon substrate using a flip-chip bonder, and then, an optical converting part is mounted on the VCSEL element and the photodiode element using a flip-chip bonder. For the adhesion, an epoxy-based curable resin is used and cured by UV irradiation.

<Mounting of Optical Reception and Transmission Module>

The first end portion of the optical waveguide film adjusted in the Example 1 is inserted into the hole portion of the one supporting member mounted on the silicon substrate, and the second end portion is inserted into the hole portion of the other supporting member mounted on the silicon substrate. The epoxy-based resin curable resin for core is applied between each of the end portions of the optical waveguide film inserted into each of the hole portions and each of the optical path converting parts, and is subjected to UV irradiation for fixing, by which an optical reception and transmission module is manufactured.

As described above, since by inserting each of the end portions of the optical waveguide film into the hole portion of the supporting member mounted on the silicon substrate and then fixing the same, the optical reception and transmission module is manufactured, it may be said that the optical reception and transmission module is easily manufactured in the simple process. Moreover, since the supporting member that supports each of the end portions of the optical waveguide film is manufactured in the simple process as described above, it may be said that the optical reception and transmission module suitable for mass production is provided.

Furthermore, applying the below-described fire-resistant to the surface of this optical reception and transmission module will improve fire resistance.

<Application of Fire-resistant Resin>

As the fire-resistant resin, a one-pack type condensation curable type silicon resin manufactured by Shin-Etsu Chemical Co., Ltd is prepared.

—Characteristics of Fire-Resistant Resin Used in Example 1—
  Viscosity when the resin is uncured: 20 Pa·s
  Tensile strength: 4.0 MPa
  Content of low-molecular siloxane having a cyclic dimethyl type bond content of D3 (trimer) to D20 (20-mer): less than 300 ppm
  Type of fire-resistant filler: silicon oxide and titanium oxide
  Total content of the fire-resistant filler: 50% by weight
  Fire resistance according to UL-94 test: V-0

This fire-resistant resin is applied using an application robot (trade name: FAD320S, manufactured by MUSASHI ENGINEERING Inc.) so as to cover the optical waveguide film surface of the optical reception and transmission module, which is adjusted in the Example 1, the VCSEL element, the photodiode element, a power supply circuit, and wires as various electrodes, which are mounted on the substrate, and then is left at a room temperature (25° C.) for 10 minutes to be cured.

A measurement showed that a layer thickness of the fire-resistant resin layer formed by curing the applied fire-resistant resin is 0.2 mm.

A minimum bending radius of the optical waveguide film whose surface is covered with the fire-resistant resin is measured according to ASTM D-2176 to find that the minimum bending radius of the optical waveguide film covered with the fire-resistant resin is 1.5 mm. Thus, it may be said that an optical reception and transmission module excellent in bending performance and fire resistance is provided.

EXAMPLE 2

Manufacturing of Optical Waveguide Film

In cutting the three-layered film adjusted in the Example 1 by the dicing saw, the same materials and the same method as those in Example 1 are used to adjust an optical waveguide film except that the film is cut from a principal surface (top surface) side at a precision of 75 μm±5 μm and then, is moved 50 μm to be cut, by which a single core having a core diameter of 50 μm is formed.

<Manufacturing of Optical Path Converting Part>

In cutting the three-layered film adjusted in the manufacturing of the optical path converting part of the Example 1 by the dicing saw, an optical path converting part is adjusted as in Example 1 except that the film is cut from a principal surface (top surface) side at a precision of 110 μm±5 μm and next, is moved 50 μm to be cut, by which a single core having a core diameter of 50 μm is formed.

<Manufacturing of Supporting Member, Mounting of Module, and Mounting of Optical Reception and Transmission Module>

Supporting members are manufactured using the same method and the same material as those in Example 1. Moreover, the mounting on the module and the mounting of the optical reception and transmission module are performed as in Example 1 except that the optical waveguide film and the optical path converting parts adjusted in Example 2 are used as an optical waveguide film and optical path converting parts.

As described above, the respective end portions of the optical waveguide film are inserted into the hole portions of the supporting members mounted on the silicon substrates, and then are fixed to thereby manufacture the optical reception and transmission module. Thus, it may be said that in the simple process, the optical reception and transmission module is easily manufactured. Moreover, since the supporting members that support the respective end portions are manufactured in the simple process as described above, it may be said that an optical reception and transmission module suitable for mass production is provided.

Furthermore, applying the fire-resistant as in Example 1 on the surface of this optical reception and transmission module improves fire resistance.

What is claimed is:

1. An optical reception and transmission module comprising:
   an optical waveguide film that guides light;
   an optical transmission unit comprising a light emitting element, a first optical path converting part that guides light, and that comprises, at a first end surface thereof in an optical waveguide direction, a mirror surface that bends light which is emitted from the light emitting element and which enters the first optical path converting part from an incident end surface thereof, and a first holding member that holds the light emitting element and the first optical path converting part so that the light emitted from the light emitting element is coupled to the incident end surface of the first optical path converting part;
   an optical reception unit comprising a light receiving element, a second optical path converting part that guides light and comprises, at a first end surface thereof in the optical waveguide direction, a mirror surface that bends the guided light, and a second holding member that holds the light receiving element and the second optical path converting part so that the light bent by the mirror surface of the second optical path converting part is received by the light receiving element;
   a first supporting member comprising a first hole portion into which a first end portion of the optical waveguide film is inserted, and which supports the first end portion of the optical waveguide film inserted into the first hole portion so that a first end surface of the optical waveguide film in the optical waveguide direction and a second end surface of the first optical path converting part in the optical waveguide direction are optically coupled; and
   a second supporting member comprising a second hole portion into which a second end portion of the optical waveguide film is inserted, and which supports the second end portion of the optical waveguide film inserted into the second hole portion so that a second end surface of the optical waveguide film in the optical waveguide direction and a second end surface of the second optical path converting part in the optical waveguide direction are optically coupled,
   wherein at least one of the first supporting member or the second supporting member is formed by layering a transparent second member on a first member comprising a recessed portion.

2. The optical reception and transmission module of claim 1, wherein in the first hole portion, an inner peripheral diameter continuously becomes smaller approaching the second end surface side of the first optical path converting part, and an inner peripheral diameter of the first hole portion is equal to or greater than an outer peripheral diameter of the optical waveguide film.

3. The optical reception and transmission module of claim 1, wherein in the second hole portion, an inner peripheral diameter continuously becomes smaller as it approaches the second end surface side of the second optical path converting part, and an inner peripheral diameter of the second hole portion is equal to or greater than an outer peripheral diameter of the optical waveguide film.

4. The optical reception and transmission module of claim 2, wherein in the second hole portion, an inner peripheral diameter continuously becomes smaller as it approaches the second end surface side of the second optical path converting part, and an inner peripheral diameter of the second hole portion is equal to or greater than an outer peripheral diameter of the optical waveguide film.

5. The optical reception and transmission module of claim 1, wherein the first supporting member is held by the first holding member, and the second supporting member is held by the second holding member.

6. The optical reception and transmission module of claim 1, wherein a minimum bending radius of the optical waveguide film is 1 mm or more and 3 mm or less.

7. The optical reception and transmission module of claim 1, wherein the optical waveguide film, and at least one of the optical transmission unit, the optical reception unit, the first supporting member, and the second supporting member are covered with a fire-resistant resin.

8. The optical reception and transmission module of claim 1, wherein each of the optical waveguide film, the first optical path converting part, and the second optical path converting part comprises a core portion, and a cladding portion surrounding the core portion,
the first end surface of the optical waveguide film in the optical wave guide direction and the second end surface of the first optical path converting part are adhered by an adherent made of a material that makes up the core portion,
and the second end surface of the optical waveguide film in the optical waveguide direction and the second end surface of the second optical path converting part are adhered by the adherent.

9. The optical reception and transmission module of claim 8, wherein the core portion of the optical waveguide film has a refractive index higher than the cladding portion of the optical waveguide film, and a refractive index difference is 2% or more and 5% or less.

10. The optical reception and transmission module of claim 1, wherein the resultant of layering the second transparent layer on the first member comprising the recessed portion is cut by a dicing saw in a direction intersecting a penetration direction of a hole portion formed by layering the second member on the first member.

11. The optical reception and transmission module of claim 10, wherein the recessed portion has a shape corresponding to an outer periphery of the optical waveguide film.

12. The optical reception and transmission module of claim 10, wherein the recessed portion is formed by a dicing saw, etching, or reactive ion etching.

13. The optical reception and transmission module of claim 10, wherein the first member is made of a Si, Ni, Cu or glass substrate, and the second member is made of glass or plastic.

14. The optical reception and transmission module of claim 10, wherein the second member is heat-resistant.

15. An optical module comprising:
an optical waveguide film which guides light and has an end surface;
an optical path converting part which bends light and has an end surface;
a holding member which holds the optical path converting part;
a supporting member comprising a hole portion into which an end portion of the optical waveguide film is inserted, and which supports the end portion of the optical waveguide film inserted into the hole portion so that the surface of the optical waveguide film and the end surface of the optical path converting part are optically coupled, wherein the supporting member is formed by layering a transparent second member on a first member comprising a recessed portion.

16. The optical module of claim 15, wherein the supporting member is formed by layering a transparent second member on a first member comprising a recessed portion, and then cutting the resultant by a dicing saw in a direction intersecting a penetration direction of a hole portion formed by layering the second member on the first member.

* * * * *